(12) United States Patent
Tian et al.

(10) Patent No.: US 8,940,625 B2
(45) Date of Patent: Jan. 27, 2015

(54) LOW TEMPERATURE POLYSILICON THIN FILM AND MANUFACTURING METHOD THEREOF

(71) Applicant: Boe Technology Group Co., Ltd., Beijing (CN)

(72) Inventors: Xueyan Tian, Beijing (CN); Chunping Long, Beijing (CN); Jiangfeng Yao, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 13/980,478

(22) PCT Filed: Dec. 10, 2012

(86) PCT No.: PCT/CN2012/086310
§ 371 (c)(1),
(2) Date: Jul. 18, 2013

(87) PCT Pub. No.: WO2013/127223
PCT Pub. Date: Sep. 6, 2013

(65) Prior Publication Data
US 2014/0065804 A1    Mar. 6, 2014

(30) Foreign Application Priority Data
Mar. 1, 2012 (CN) .......................... 2012 1 0052305

(51) Int. Cl.
*H01L 21/20* (2006.01)
*H01L 21/02* (2006.01)
(Continued)

(52) U.S. Cl.
CPC .......... *H01L 21/02502* (2013.01); *C23C 16/24* (2013.01); *H01L 21/268* (2013.01); *H01L 21/32055* (2013.01); *H01L 21/02488* (2013.01); *H01L 21/02532* (2013.01); *H01L 21/02595* (2013.01); *H01L 21/02686* (2013.01); *C23C 16/0272* (2013.01); *C23C 16/56* (2013.01);
(Continued)

(58) Field of Classification Search
USPC ................. 438/479, 482, 486, 487, 488, 490
See application file for complete search history.

(56) References Cited

U.S. PATENT DOCUMENTS

| 5,766,989 A | 6/1998 | Maegawa et al. |
| 2011/0117685 A1* | 5/2011 | Kim et al. ........................ 438/23 |

FOREIGN PATENT DOCUMENTS

| CN | 1131340 A | 9/1996 |
| CN | 102709160 A | 10/2012 |

(Continued)

OTHER PUBLICATIONS

First Chinese Office Action dated Mar. 28, 2014; Appln. No. 201210052305.8.
International Search Report mailed Mar. 14, 2013; PCT/CN2012/086310.
International Preliminary Report on Patentability dated Sep. 2, 2014; PCT/CN2012/086310.
(Continued)

*Primary Examiner* — Kevin M Picardat
(74) *Attorney, Agent, or Firm* — Ladas & Parry LLP

(57) ABSTRACT

An embodiment of the present invention relates to a low temperature polysilicon thin film and a manufacturing method thereof. The manufacturing method comprises: forming a buffer layer on a substrate (S11); forming a seed layer comprising a plurality of uniformly distributed crystal nuclei on the buffer layer by using a patterning process (S12); forming an amorphous silicon layer on the seed layer (S13); and performing an excimer laser annealing process on the amorphous silicon layer (S14).

11 Claims, 5 Drawing Sheets

(51) Int. Cl.
  *C23C 16/24*    (2006.01)
  *H01L 21/268*   (2006.01)
  *H01L 21/3205*  (2006.01)
  *C23C 16/02*    (2006.01)
  *C23C 16/56*    (2006.01)

(52) U.S. Cl.
  CPC ...... *H01L 21/0245* (2013.01); *H01L 21/02513* (2013.01); *H01L 21/02516* (2013.01); *H01L 21/02675* (2013.01); *H01L 21/02505* (2013.01)
  USPC ............................ 438/487; 438/482; 438/486

(56) References Cited

FOREIGN PATENT DOCUMENTS

| | | | |
|---|---|---|---|
| JP | 05166729 A | * | 7/1993 |
| JP | 2-861345 B2 | | 2/1999 |

OTHER PUBLICATIONS

Second Chinese Office Action dated Oct. 28, 2014; Appln. No. 201210052305.8.

* cited by examiner

LOW TEMPERATURE POLYSILICON THIN FILM AND MANUFACTURING METHOD THEREOF

TECHNICAL FIELD

Embodiments of the present invention relate to a low temperature polysilicon thin film and a manufacturing method thereof.

BACKGROUND

An Active Matrix Organic Light Emission Display (AMOLED) becomes one of candidates for the future display technology due to advantages of high image quality, short response time to a moving image, low power consumption, wide viewing angle, and ultra light and thin. In the current back plane technology for the AMOLED, technology for manufacturing a polysilicon layer comprises excimer laser annealing (ELA), solid phase crystallization (SPC), metal induced crystallization (MIC) and the like. And the excimer laser annealing (ELA) process is an only method for mass production of a polysilicon thin film for an active layer of a transistor in the back plane.

The excimer laser annealing process is a relatively complicated annealing process. For surface flatness of the polysilicon thin film, how to control grain size and grain uniformity is always a research focus in the excimer laser annealing process. Currently, an ordinary laser annealing process may cause the nonuniformity of polysilicon grains, significant roughness of the thin film (in an ordinary process, the thin film roughness at a partial place can be up to half or even more of a total thickness of the thin film), relatively small grain size of the polysilicon thin film, and uneven distribution. Because the number and the distribution of the polysilicon grains covered by a channel region of a low temperature polysilicon thin film transistor (a uniformity issue) and the surface flatness (the surface roughness) of the polysilicon thin film can directly influence electrical properties (mobility, leak current, the uniformity of the mobility and a threshold voltage and the like), how to manufacture the low temperature polysilicon thin film having smaller surface roughness and grains of large size with uniform distribution is an issue to be solved.

SUMMARY

An embodiment of the present invention provides a manufacturing method of a low temperature polysilicon thin film, and the manufacturing method comprises forming a buffer layer on a substrate; forming a seed layer which comprises a plurality of uniformly distributed crystal nuclei on the buffer layer by using a patterning process; forming an amorphous silicon layer on the seed layer; and performing an excimer laser annealing process on the amorphous silicon layer.

Another embodiment of the present invention provides a low temperature polysilicon thin film formed by using the above manufacturing method.

BRIEF DESCRIPTION OF THE DRAWINGS

In order to clearly illustrate the technical solution of the embodiments of the invention, the drawings of the embodiments will be briefly described in the following; and it is apparent that the described drawings are only related to some embodiments of the invention and thus are not limitative of the invention.

DETAILED DESCRIPTION

An embodiment of the present invention provides a manufacturing method of a low temperature polysilicon thin film, which is capable of manufacturing a low temperature polysilicon thin film having grains of large size with uniform distribution and very small surface roughness.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all embodiments of the invention. Based on the described embodiments herein, those skilled in the art can obtain other embodiment(s), without any inventive work, which should be within the scope of the invention.

Figure 1:
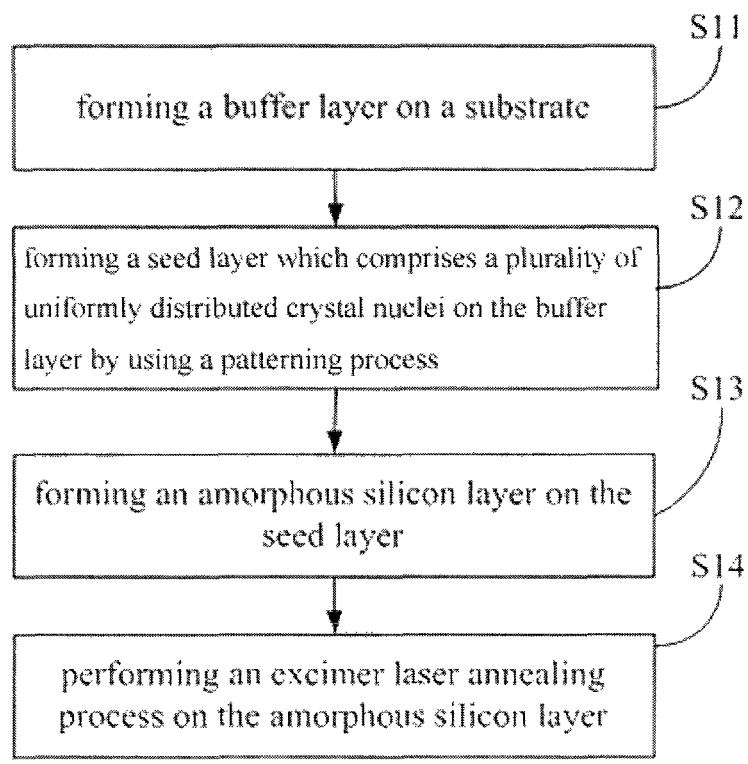
FIG. 1 is a flow chart of a manufacturing method of a low temperature polysilicon thin film according to an embodiment of the present invention.
Figure 2:
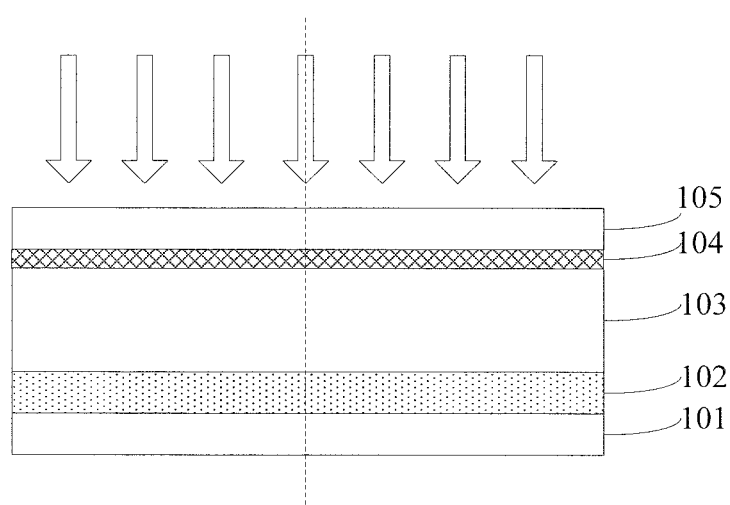
FIG. 2 is a schematic view when a step S14 is performed.

With reference to FIGS. 1 and 2, an embodiment of the present invention provides a method for manufacturing a low temperature polysilicon thin film, the method comprises the following steps, S11-S14:

S11, forming a buffer layer on a substrate 101.

Herein, as shown in FIG. 2, the buffer layer may be a composite buffer layer formed of a SiN$_x$ layer 102 and a SiO$_2$ layer 103. A method for forming the composite buffer layer on the substrate 101 may comprise: firstly, depositing the SiN$_x$ layer 102 having a thickness of 50~150 nm (the thickness may be set to any other value as needed) by using a depositing method, such as, a plasma enhanced chemical vapor deposition (PECVD) method, on the substrate 101; then, depositing the SiO$_2$ layer 103 having a thickness of 100~350 nm (the thickness may be set to any other value as needed) by using a depositing method, such as, a PECVD method, so as to form the composite buffer layer on the substrate 101.

In another embodiment, the buffer layer may be a single SiO$_2$ buffer layer, and a method for forming the SiO$_2$ buffer layer on the substrate may comprise depositing a SiO$_2$ layer having a thickness of 100~350 nm (the thickness may be set to any other value as needed) as the SiO$_2$ buffer layer by using a depositing method, such as, a PECVD method.

Before S11, the substrate 101 may be cleaned in advance to make the substrate 101 to keep clean.

In S12, a seed layer 104 with uniformly distributed crystal nuclei is formed on the buffer layer by using a patterning process.

For example, a pitch between two crystal nuclei may be 1~3 μm or any other value, and the crystal nuclei are uniformly distributed. For example, a thickness of the seed layer is 5 nm, or may be set to any other value as needed.

The above-mentioned seed layer may be embodied as an amorphous silicon seed layer (that is, a seed layer formed of amorphous silicon material), and then, S12 may comprises, for example, the following steps A1-A2.

In A1, an amorphous silicon material layer is deposited on the buffer layer by using a plasma enhanced chemical vapor deposition method.

In A2, the amorphous silicon material layer on the buffer layer is patterned into a plurality of amorphous silicon islands uniformly distributed by using a patterning process (such as, a mask process and the like). The plurality of uniformly distributed amorphous silicon islands constitute the amorphous silicon seed layer, wherein the amorphous silicon islands are used as crystal nuclei.

In addition, the above-mentioned seed layer may also be embodied as a microcrystalline silicon seed layer, and S12 may comprise, for example, the following steps B1-B2.

In B1, a microcrystalline silicon material layer is formed on the buffer layer.

Step B1 may be embodied as the following step B11:

In B11, the microcrystalline silicon material layer is deposited on the buffer layer by using a PECVD method.

A thickness of the microcrystalline silicon material layer may be, for example, 5 nm, or may be set to any other value as needed.

For example, the process condition of the step B11 may be as follows: the reaction gas flow ratio of SiH$_4$ and H$_2$ is 10~30 sccm/1000~3000 sccm, the RF power is 700~1550 W, a pressure in a depositing chamber is 700~900 mtorr, and the temperature is 240~270° C.

Alternatively, the step B1 may be embodied as the following steps B12-B13:

In B12, an amorphous silicon material layer is deposited on the buffer layer by using a PECVD method.

A thickness of the amorphous silicon material layer may be, for example, 5 nm, or may be set to any other value as needed.

For example, the process condition of the step B12 may be as follows: the reaction gas flow ratio of SiH$_4$ and H$_2$ is 100~250 sccm/500~1250 sccm, the RF power is 100~300 W, a pressure in a depositing chamber is 800~1500 mtorr and the temperature is 350~380° C.

In B13, a hydrogen plasma treatment on the amorphous silicon material layer is performed to form the microcrystalline silicon material layer.

For example, the process condition of the step B13 may be as follows: the hydrogen plasma treatment on the amorphous silicon material layer is performed for 24 seconds (the temperature is 350~380° C.), and thus, the amorphous silicon material layer may be subjected to a series of chemical reactions, and finally, becomes into the microcrystalline silicon material layer having low surface free energy.

In B2, the microcrystalline silicon material layer on the buffer layer is patterned to form a plurality of uniformly distributed microcrystalline silicon islands by using a patterning process (such as, a mask process and the like). The plurality of uniformly distributed microcrystalline silicon islands form the microcrystalline silicon seed layer, wherein the microcrystalline silicon islands are used as crystal nuclei.

In S13, an amorphous silicon layer 105 is formed on the seed layer 104.

As shown in FIG. 2, a thickness of the amorphous silicon layer 105 is, for example, 45 nm, or may be set to any other value as needed.

In S14, an excimer laser annealing process is performed on the amorphous silicon layer 105.

The excimer laser annealing process may be selectively performed once, twice, or more times on the amorphous silicon layer and the process parameters of each excimer laser annealing process may be selected according to the material, the thickness and/or other features of the seed layer and the amorphous silicon layer.

In an embodiment of the present invention, the excimer laser annealing process may be performed twice on the amorphous silicon layer, and among the two excimer laser annealing processes, the process parameters of a first excimer laser annealing process may be a laser pulse frequency of 300 Hz, a overlapping ratio of 92%~98%, a laser energy density of 300~500 mJ/cm$^2$; the process parameters of a second excimer laser annealing process may be a laser pulse frequency of 300 Hz, a overlapping ratio of 5%~10% and a laser energy density of 50~150 mJ/cm$^2$.

Figure 3:
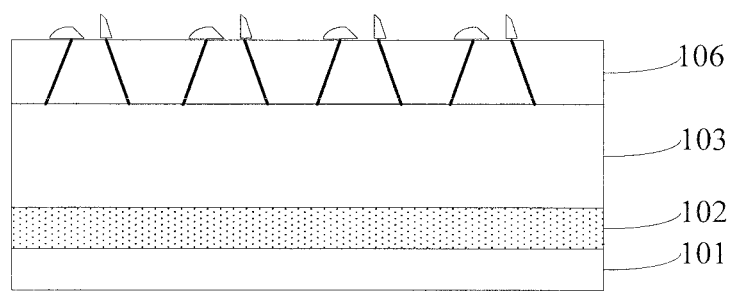
FIG. 3 is a schematic view for showing a low temperature polysilicon thin film formed by performing a first excimer laser annealing process on an amorphous silicon layer using the manufacturing method as shown in FIG. 1.
Figure 4:
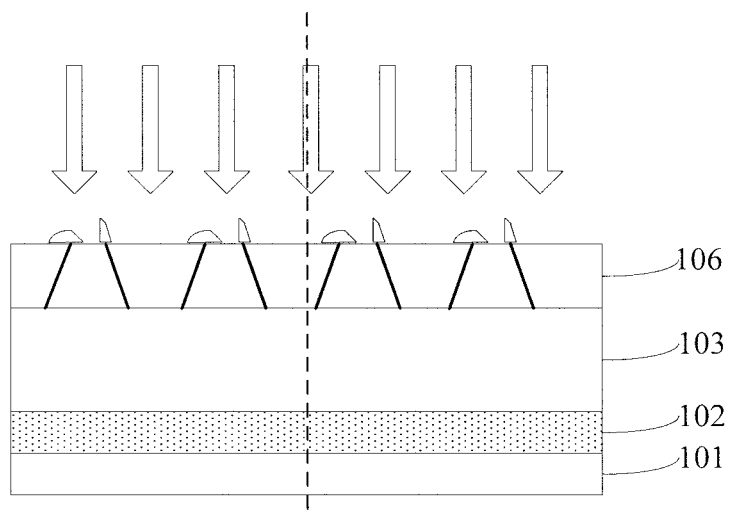
FIG. 4 is a schematic view for showing a second excimer laser annealing process on the polysilicon thin film formed in FIG. 3.
Figure 5:
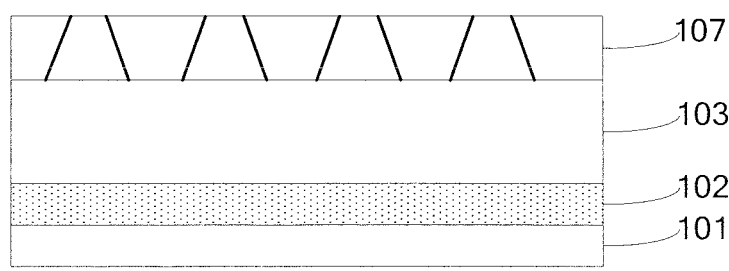
FIG. 5 is a schematic view for showing a low temperature polysilicon thin film formed by performing a second excimer laser annealing process on the polysilicon thin film formed in FIG. 3.

As shown in FIG. 3, in a low temperature polysilicon thin film 106 formed after the first excimer laser annealing process, the grain size of a polysilicon may be up to about 600 μm, the grain size of the polysilicon manufactured according to the ordinary manufacturing process is about 200~300 μm. However, the low temperature polysilicon thin film 106 formed by the first excimer laser annealing process also has a significant surface roughness, which is about 10~20 nm. As shown in FIG. 4, the second excimer laser annealing process is performed on the low temperature polysilicon thin film 106 which is formed by the first excimer laser annealing process so as to form the low temperature polysilicon thin film 107 (as shown in FIG. 5), the grain size of the polysilicon thereof may be up to about 600 μm and the polysilicon grains are uniformly distributed, and surface roughness thereof is only about 2 nm, which is a high quality low temperature polysilicon thin film.

Alternatively, the excimer laser annealing process may be performed on the amorphous silicon layer for three times or more so as to obtain a higher quality low temperature polysilicon thin film.

Hereinafter, the principle on which a method for manufacturing the low temperature polysilicon thin film provided by an embodiment of the present invention can manufacture the high quality low temperature polysilicon thin film will be explained.

A method for manufacturing a low temperature polysilicon thin film according to an embodiment of the present invention comprises forming a buffer layer on a substrate; forming a seed layer on the buffer layer by using a patterning process, wherein the seed layer comprises a plurality of uniformly distributed crystal nuclei; forming an amorphous silicon layer on the seed layer; and performing an excimer laser annealing process on the amorphous silicon layer.

Herein, the seed layer is formed by using the patterning process, the positions of the crystal nuclei may be precisely controlled as needed, and thus the crystal nuclei in the seed layer may be positioned more precisely, and the crystal nuclei can be distributed more uniformly.

Figure 6A:
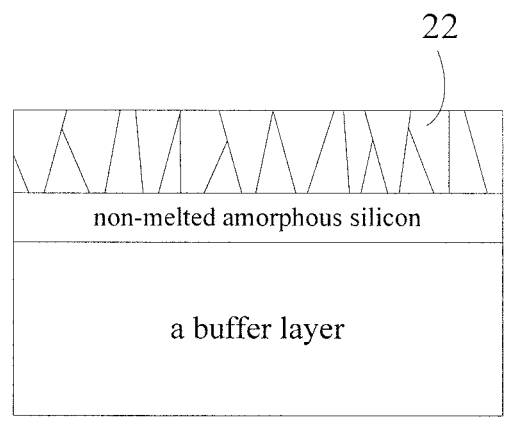
FIG. 6A is a schematic view showing a polysilicon grain formed when an amorphous silicon layer is in a partially melted state.
Figure 6B:
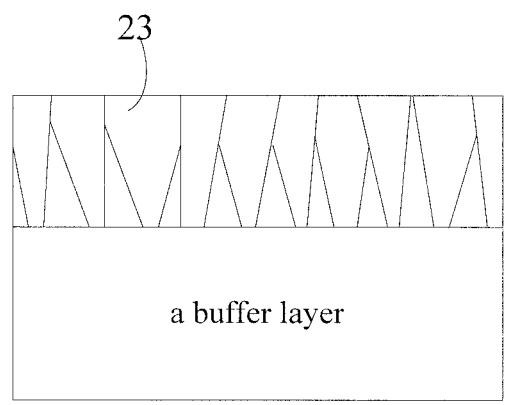
FIG. 6B is a schematic view showing a polysilicon grain formed when an amorphous silicon layer is in a "completely melted" state.
Figure 6C:
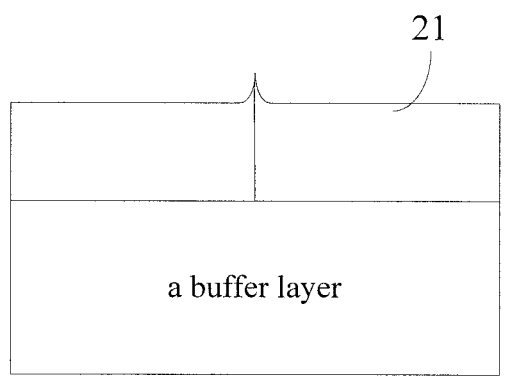
FIG. 6C is a schematic view showing a polysilicon grain formed using a manufacturing method according to an embodiment of the present invention.
Figure 6D:
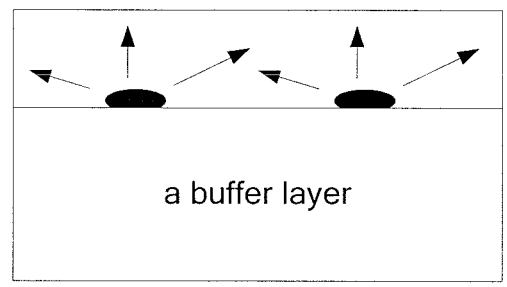
FIG. 6D is a schematic view showing that grains continue growing when a microcrystalline silicon seed layer is used as a crystal nucleus.

When the excimer laser annealing process on the amorphous silicon layer is performed, the excimer laser annealing process may be performed once, twice, or more times on the amorphous silicon layer and the process parameters of each excimer laser annealing process may be set according to the material, the thickness and/or other features of the seed layer and the amorphous silicon layer. For example, the excimer laser annealing process may be performed twice on the amorphous silicon layer, and after the first excimer laser annealing process is performed on the amorphous silicon layer, the seed layer may facilitate the formation of the polysilicon in the amorphous silicon layer from a viewpoint of thermodynamics. For example, after the amorphous silicon layer is irradiated with the laser, liquid amorphous silicon is formed. To make the amorphous silicon layer in a "almost completely melted" state or "completely melted" state (FIG. 6B is a schematic view showing polysilicon grains formed when the amorphous silicon layer is in a "completely melted" state, and the reference numeral 23 denotes the grains) and not in a "partially melted" state (FIG. 6A is a schematic view showing polysilicon grains formed when the amorphous silicon layer is in a partially melted state, and the reference numeral 22 denotes the grains), the seed layer will function as a nucleating grain positioned at a bottom of the amorphous silicon layer, the nucleating grain has a low energy and easily continue nucleating and growing so as to finally form a larger polysilicon grain. In addition, since the nucleating grains of the seed layer are uniformly distributed, the polysilicon grains having large size are uniformly distributed (as shown in FIG. 6C, the reference numeral 21 denotes the grains). In addition, FIG. 6D is a schematic view showing that the microcrystalline silicon seed layer as a crystal nucleus makes the grains to continue growing. In the low temperature polysilicon thin film formed by performing the first excimer laser annealing process on the amorphous silicon layer, there is a relatively obvious grain boundary, and thus unevenness of a thin film surface is caused and the surface roughness thereof is significant. During the second excimer laser annealing process, the surface of the amorphous silicon layer is again melted, and because of the selected relatively low repetition rate, the collision of the solid and liquid phases is avoided during grain growth, so that the protrusions are reduced and the surface roughness of the low temperature polysilicon thin film is improved.

The low temperature polysilicon thin film manufactured by using a method for manufacturing the low temperature polysilicon thin film according to an embodiment of the present invention has large grain size and very small surface roughness, and the grains thereof are uniformly distributed, so that problem of low mobility, large leak current of a transistor and the nonuniformity of mobility and a threshold voltage in a back plane of a low temperature polysilicon display is solved.

The low temperature polysilicon thin film manufactured by using a method for manufacturing the low temperature polysilicon thin film according to an embodiment of the present invention may be used as an active layer in an active matrix organic light emission display (AMOLED) and a low temperature polysilicon thin film transistor-liquid crystal display (LTPS TFT-LCD), and is suitable for production of an AMOLED, a LIPS TFT-LCD and the like.

In addition, an embodiment of the present invention also provides a low temperature polysilicon thin film formed by using the above-mentioned method for manufacturing the low temperature polysilicon thin film.

Based on the above description, an embodiment of present invention may provide the following method and structure:

(1) A manufacturing method of a low temperature polysilicon thin film, comprising: forming a buffer layer on a substrate; forming a seed layer which comprises a plurality of uniformly distributed crystal nuclei on the buffer layer by using a patterning process; forming an amorphous silicon layer on the seed layer; and performing an excimer laser annealing process on the amorphous silicon layer.

(2) According to the manufacturing method (1), the seed layer is an amorphous silicon seed layer, and forming the seed layer which comprises a plurality of uniformly distributed crystal nuclei on the buffer layer by using a patterning process comprises depositing an amorphous silicon material layer on the buffer layer using a plasma enhanced chemical vapor deposition method; patterning the amorphous silicon material layer on the buffer layer into a plurality of uniformly distributed amorphous silicon islands by using a patterning process, and the plurality of amorphous silicon islands are used as a plurality of crystal nuclei.

(3) According to the manufacturing method (1), the seed layer is a microcrystalline silicon seed layer, and the forming the seed layer which comprises a plurality of uniformly distributed crystal nuclei on the buffer layer by using a patterning process comprises forming a microcrystalline silicon material layer on the buffer layer; and patterning the microcrystalline silicon material layer on the buffer layer into a plurality of uniformly distributed microcrystalline silicon islands by using a patterning process, and the plurality of microcrystalline silicon islands are used as a plurality of crystal nuclei.

(4) According to the manufacturing method (3), wherein forming the microcrystalline silicon material layer on the buffer layer comprises depositing the microcrystalline silicon material layer on the buffer layer using a plasma enhanced chemical vapor deposition method; or, forming the microcrystalline silicon material layer on the buffer layer comprises depositing an amorphous silicon material layer on the buffer layer using a plasma enhanced chemical vapor deposition method; and performing a hydrogen plasma treatment on the amorphous silicon material layer so as to form the microcrystalline silicon material layer.

(5) According to the manufacturing method (1), before performing the excimer laser annealing process on the amorphous silicon layer, the method further comprises under the temperature of 400~500° C., performing a high temperature treatment on the amorphous silicon layer for 0.5 h~3 h.

(6) According to the manufacturing method (1) or (5), wherein performing an excimer laser annealing process on the amorphous silicon layer comprises performing a first excimer laser annealing process and a second excimer laser annealing process on the amorphous silicon layer, and process parameters of the first excimer laser annealing process are a laser pulse frequency of 300 Hz a overlapping ratio of 92%~98% and a laser energy density of 300~500 mJ/cm$^2$; and process parameters of the second excimer laser annealing process are a laser pulse frequency of 300 Hz, a overlapping ratio of 5%~10% and a laser energy density of 50~150 mJ/cm$^2$.

(7) According to the manufacturing method (1), wherein the buffer layer is a composite buffer layer comprising a SiN$_x$ layer and a SiO$_2$ layer; or the buffer layer is a SiO$_2$ buffer layer.

(8) According to the manufacturing method (1), wherein a pitch between two crystal nuclei is 1~3 μm and a thickness of the seed layer is 5 nm.

(9) A low temperature polysilicon thin film manufactured using any one method of (1) through (8).

The above description is merely the preferred implementations of the present invention. It should be noted that, for the ordinary skilled in the art, improvements and modifications can be made without departing from the principles of the present invention, also these improvements and modifications should be regarded as within the scope of the invention.

A manufacturing method provided by the embodiments of the present invention is capable of manufacturing a low temperature polysilicon thin film having large grain size, uniformly distributed grains, and very low surface roughness. When the low temperature polysilicon thin film manufactured by the method of the embodiments of the present invention is applied to a back plane of a low temperature polysilicon thin film transistor-liquid crystal display, the problem of low mobility, large leak current of a transistor and the non-uniformity of the mobility and a threshold voltage can be solved.

The invention claimed is:

1. A manufacturing method of a low temperature polysilicon thin film, comprising:
   forming a buffer layer on a substrate;
   forming a seed layer which comprises a plurality of uniformly distributed crystal nuclei on the buffer layer by using a patterning process;
   forming an amorphous silicon layer on the seed layer; and
   performing an excimer laser annealing process on the amorphous silicon layer.

2. The manufacturing method according to claim 1, wherein the seed layer is an amorphous silicon seed layer, and the forming the seed layer which comprises a plurality of uniformly distributed crystal nuclei on the buffer layer by using the patterning process comprises: depositing an amorphous silicon material layer on the buffer layer using a plasma enhanced chemical vapor deposition method; and patterning the amorphous silicon material layer on the buffer layer into a plurality of uniformly distributed amorphous silicon islands by using a patterning process, and the plurality of amorphous silicon islands are used as a plurality of crystal nuclei.

3. The manufacturing method according to claim 1, wherein the seed layer is a microcrystalline silicon-type seed layer, and the forming the seed layer which comprises a plurality of uniformly distributed crystal nuclei on the buffer layer by using the patterning process comprises: forming a microcrystalline silicon material layer on the buffer layer; and patterning the microcrystalline silicon material layer on the buffer layer into a plurality of uniformly distributed microcrystalline silicon islands by using a patterning process, and the plurality of microcrystalline silicon islands are used as a plurality of crystal nuclei.

4. The manufacturing method according to claim 3, wherein the forming a microcrystalline silicon material layer on the buffer layer comprises: depositing the microcrystalline silicon material layer on the buffer layer using a plasma enhanced chemical vapor deposition method.

5. The manufacturing method according to claim 1, before performing an excimer laser annealing process on the amorphous silicon layer, further comprising: under the temperature of 400~500° C., performing a high temperature treatment on the amorphous silicon layer for 0.5~3 hours.

6. The manufacturing method according to claim 1, wherein the performing an excimer laser annealing process on the amorphous silicon layer comprises performing a first excimer laser annealing process and a second excimer laser annealing process on the amorphous silicon layer, wherein process parameters of the first excimer laser annealing process are a laser pulse frequency of 300 Hz, a overlapping ratio of 92%~98% and a laser energy density of 300~500 mJ/cm$^2$, and process parameters of the second excimer laser annealing process are a laser pulse frequency of 300 Hz, a overlapping ratio of 5%~10% and a laser energy density of 50~150 mJ/cm$^2$.

7. The manufacturing method according to claim 1, wherein the buffer layer is a composite buffer layer comprising a $SiN_x$ layer and a $SiO_2$ layer; otherwise, the buffer layer is a $SiO_2$ buffer layer.

8. The manufacturing method according to claim 1, wherein a pitch between two crystal nuclei is 1~3 μm and a thickness of the seed layer is 5 nm.

9. A low temperature polysilicon thin film manufactured using any one method of claim 1.

10. The manufacturing method according to claim 3, wherein the forming a microcrystalline silicon material layer on the buffer layer comprises: depositing an amorphous silicon material layer on the buffer layer using a plasma enhanced chemical vapor deposition method; and performing a hydrogen plasma treatment on the amorphous silicon material layer to form the microcrystalline silicon material layer.

11. The manufacturing method according to claim 5, wherein the performing an excimer laser annealing process on the amorphous silicon layer comprises performing a first excimer laser annealing process and a second excimer laser annealing process on the amorphous silicon layer, wherein process parameters of the first excimer laser annealing process are a laser pulse frequency of 300 Hz a overlapping ratio of 92%~98% and a laser energy density of 300~500 mJ/cm$^2$, and process parameters of the second excimer laser annealing process are a laser pulse frequency of 300 Hz, a overlapping ratio of 5%~10% and a laser energy density of 50~150 mJ/cm$^2$.

* * * * *